April 15, 1969 S. TESZNER 3,439,192

CONTROL CIRCUITS FOR FIELD-EFFECT BIPOLAR SWITCHING DEVICES

Filed May 19, 1965

INVENTOR
STANISLAS TESZNER

BY Abraham A. Soffitz
ATTORNEY

United States Patent Office
3,439,192
Patented Apr. 15, 1969

3,439,192
CONTROL CIRCUITS FOR FIELD-EFFECT BIPOLAR SWITCHING DEVICES

Stanislas Teszner, Paris, France, assignor to Societe de Constructions Electro-Mecaniques Jeumont-Schneider, Paris, France Filed May 19, 1965, Ser. No 457,129
Claims priority, application France, May 27, 1964, 975,762
Int. Cl. H03k *3/26, 19/08, 23/08*
U.S. Cl. 307—304 5 Claims

ABSTRACT OF THE DISCLOSURE

Novel control circuits for field-effect bipolar switching devices operating on the principle of bipolar conductance modulation by electrical field-effect. The modulation operation requires fast extraction of minority carriers in view of rapid extension of the depletion layer.

Figures 1, 2, 3:
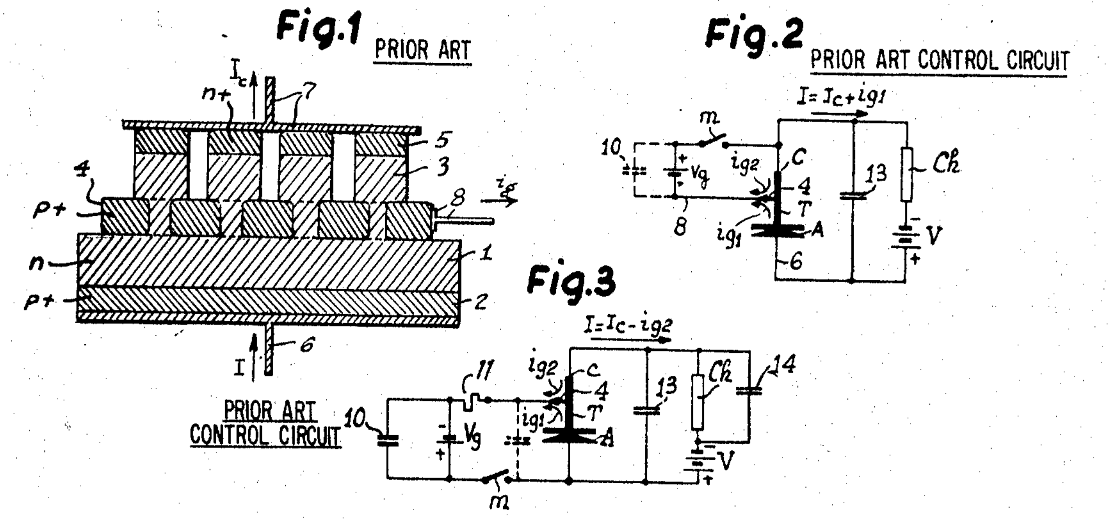

The new control circuits enhance the field-effect, quickly extracting the minority carriers and extending the depletion layers to divert the minority carrier current through a particular control circuit during the switch-off operation. This control circuit avoids the super-position of this current on the load current and reduces the duration of the switch-off operation to a minimum.

To divert the minority carrier current at least one control circuit must be connected between the anode terminal and the control electrode. Two features of this arrangement are presented, the one with a simple control-circuit, the other with a double control-circuit. In the latter case, the extraction current in the diverting circuit will be enhanced by a short but strong pulse voltage from a control transformer, induced by the variation of the current in the control circuit or in the load circuit. In the former case, the control voltage is strengthened by the voltage of the load circuit.

New control circuits include controls for a plurality of switching device units in series and also for a pair of switching device units connected to each other in inverted relation in order to control an A.C. load current.

The present invention relates to novel control circuits embodying semiconductor switching devices, particularly devices whose operation is based upon a field-effect modulating a bipolar conductance. The new control circuits of the present invention are more particularly constructed to control the operation of static switches of the type known under the name of "power tecnetrons" which are the subject matter of copending U.S. patent application Ser. No. 345,419, filed by the present inventor on Feb. 17, 1964. These power tecnetrons are described completely in the Revue Jeumont, 1963, No. 60, pages 21 to 33, in regard to construction and operation.

The power tecnetron switches used in the present invention are characterized by their mode of operation in which the transfer of current between the terminal electrodes is due to their majority and minority charge carriers which have densities of the same order of magnitude. This particular mode of operation poses new and difficult problems for adequate control of such power switching devices. The present invention relates to certain new control circuits embodying these new power switching devices to provide new uses and capabilities for these devices which extend beyond the use and capabilities described in the inventor's publication and prior patents.

An object of the invention is to provide new control circuits embodying a field-effect power tecnetron switch, the combination of control circuit and switch modulating a bipolar conductance in a novel manner to provide new uses in static A.C. and D.C. switching.

Other and further objects of the present invention will appear from the more detailed description set forth below, it being understood that such more detailed description is given by way of ilustration and explanation only and not by way of limitation, since various changes therein may be made by those skilled in the art without departing from the scope and spirit of the present invention.

Figure 4:
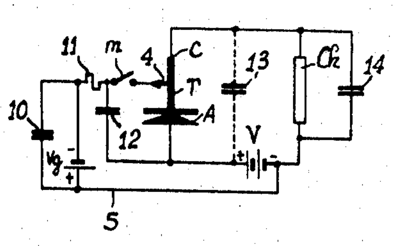
Figure 5:
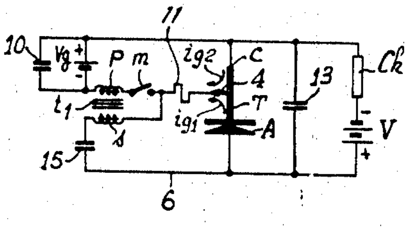
Figure 7:
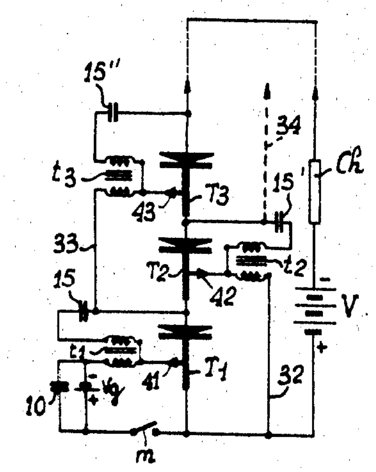
Figure 6:
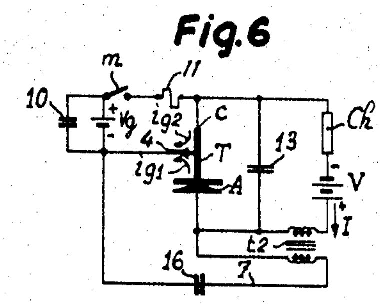
Figure 8:
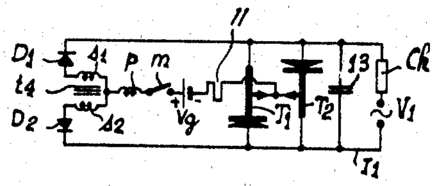

In connection with that more detailed description, there is shown in the drawing, in:

FIG. 1, a schematic representation in cross section of the field-effect power tecnetron of the p-n-p type, as described in my above said copending application, illustrating a socket of n-type semiconductor material, an annular control ring or neck mounted above one of the promontories on the socket, inlet and outlet electrodes and a control electrode for the neck;

FIG. 2, a schematic circuit diagram illustrating the prior art control circuit shown in my aforesaid copending application embodying the power tecnetron of FIG. 1, a voltage source, a control switch and a plurality of capacitance elements between the input lines and the output lines in order to control the current and voltage characteristics;

FIG. 3, a schematic circuit diagram illustrating another embodiment of the prior art control circuit shown in my copending application;

FIG. 4, a schematic circuit diagram of a direct current switch according to the invention embodying a novel arrangement for controlling the operation of a power tecnetron switch;

FIG. 5, a schematic circuit diagram of an inductively coupled control circuit in accordance with the invention;

FIG. 6, a schematic circuit diagram of a second inductively coupled control circuit in accordance with the invention;

FIG. 7, a schematic diagram of a series circuit embodying inductively coupled controls in accordance with the invention; and FIG. 8, a schematic diagram of an alternating current switch in accordance with the invention.

To more clearly set forth the problems which are solved by the new control circuits of the present invention, reference is made to FIGS. 1, 2 and 3 representing the power transistor and control circuits therefor known in the prior art.

FIG. 1 of the attached drawing provides a schematic representation of the special power tecnetron device of the known type. There is seen in the prior art of FIG. 1 a socket 1 which consists of n-type semiconductive material, a p+ type anode designated as 2 which includes an electrical connection 6 through which input current I passes; the n-type socket 1 includes a plurality of semiconductive multiple channels 3 which are formed of the same n-type semiconductive material as the socket. Each of the channels 3 carries at its top an n+ type terminal zone 5 and is provided with an electrical conductor 7 through which output current $I_c$ passes. The power tecnetron device is further provided with a control electrode 4, which may be for instance of p+ type semiconductive material, and this control electrode 4 is connected to a conductor 8 through which control current $i_g$ passes. This last-named control electrode 4 is hereafter called a "neck" electrode or "neck."

The anode junction 1–2 in the embodiment of FIG. 1 is the full equivalent of a diode that may be shunted and that acts as a minority carrier source, while the cathode junction 5–3 acts as a majority carrier source of the power tecnetron. Modulation of the main current that goes through the power tecnetron is assured by junction 4–1 whose modulating action is two-fold:

(1) The diode junction 4–1 assures the extraction of minority carriers of current $I_c$;

(2) This junction 4–1 by virtue of its annular shape produces a strangulation of the conductive channels 3 by the field-effect causing the formation and development of space charges which finally assure the blocking of the current $I_c$ by its "striction."

Due to the special geometrical arrangement and the particular kind of operation based on the field-effect, the operating characteristics of the above power tecnetron are notably improved if the values of $I_c$ are large.

It will be understood that in the field-effect power tecnetron herein illustrated and described, the extraction of the minority carriers has to be carried out before the full striction, which is due to the above said strangulation of the channel 3 by the formation of space charges causing blockage. To benefit fully from the improved characteristics of the new apparatus, it is essential to develop new control circuits which are specially adapted to the two operating above mentioned phenomena of minority carrier extraction and of blocking the current. The present invention provides new control circuits which are particularly adapted to activate and to enhance as fully as possible the extraction of the minority carriers, because if no special accelerating means are used, these carriers may produce an excessive lengthening of residual currents which continue to flow after the striction effect.

FIGS. 2 and 3 of the drawing illustrate, according to the copending application cited hereinbefore, the control circuits of the field-effect power tecnetrons of the prior art which are represented by the graphic symbol T; this symbol, which is used in all of the other figures, comprises a base diode A with its conductive channel, a cathode C and a transverse outlet 4 of the minority carriers. In the known arrangement according to FIG. 2, the biasing of the neck 4 is effected by applying a negative striction voltage $V_g$ between the neck 4 and the cathode C under the control of the switch *m*. This operation has to evacuate the minority carriers which are localized, on the one hand, between the neck 4 and cathode C and, on the other hand, between the neck 4 and anode A.

The first group of above said minority carriers (between neck 4 and cathode C) is evacuated rapidly by a strong and short impulsion of current $i_{g2}$ which passes through the control circuit in the direction of the corresponding arrow. The second group of carriers (between neck 4 and anode A) comes from the space located between the three layers p+-n-p+, but this space presents a substantial voltage barrier which slows down their evacuation. Accordingly, the corresponding current $i_{g1}$ must flow through the charge C*h* and the operating voltage source V so that it is superposed on the main current $I_c$ and this prolongs the decrease of the total current I which is the main current of the present power device.

According to the invention, this last-named drawback is avoided in a new way and, as shown in the circuits illustrated in FIGS. 4–8, herein, the blocking of the controlled circuits being accelerated by additional circuit arrangements which consist essentially in novel shunt circuit means diverting the minority carrier extraction currents through additional circuits which are subordinated to the load current so as to strengthen the extraction currents and to accelerate blocking of the main current without increasing the power or the voltage of the control power source.

The diverting of the extraction currents is obtained in the various arrangements illustrated in FIGS. 4–8 herein in a manner different than that shown in the prior art. It has to be noted that the diverting of the extraction current can be achieved in a known manner as shown in FIG. 3 by applying the control voltage $V_g$ between neck 4 and anode A, whereby the current $i_{g1}$ no longer passes through the load circuit and the current $i_{g2}$ is opposed to the main current $I_c$. The circuit concept of FIG. 3 may provide a faster blocking of the resulting current I, especially by adjusting suitably the characteristics of the control circuit by suitable impedances and capacitance means which are designated by 10, 11, 13 and 14 in FIG. 3. But in this known arrangement the striction voltage which is required must be at least equal to and preferably greater than the sum of $V_g+V$; in certain cases this is undesirable. On the other hand, the whole control energy must be furnished by a source of control current which is not subordinated to the operation of the tecnetron; this is another drawback.

FIGS. 4 to 8, inclusive, of the drawing illustrate certain preferred embodiments of the invention by way of example which make it possible not only to accelerate the complete striction of the main current but also to reduce the voltage and the power of the control source, thereby accomplishing an economy and greater efficiency of operation.

FIG. 4 represents a novel control circuit arrangement wherein the control voltage is strengthened by the voltage of the load circuit. According to FIG. 4, the circuit which controls the semiconductor device T operating as a direct current switch, is connected between its neck 4 and its anode A so as to be subordinated to the main circuit of the load C*h* by the fact that, as shown, operating voltage V is introduced therein by a shunt interconnection 5, whereby it is added to the control voltage $V_g$ when switch *m* is closed. Voltage V thus strengthens the action of $V_g$ whose value can remain low.

According to FIG. 5, two inductively coupled control circuits are used by combining in a new way the two modes of control of neck 4 as shown in FIGURES 2 and 3, e.g., when switch *m* is closed, the strong surge of current $i_{g2}$ excites the primary winding *p* of a control transformer $t_1$ whose secondary winding *s* strengthens current $i_{g1}$. This strengthened current very rapidly evacuates the carriers located between neck 4 and anode A through the shunt circuit 6 which includes a capacitor 15, and after this evacuation the accelerated striction is maintained by action of the low voltage $V_g$ which is solely applied between neck 4 and cathode C. As in the preceding example, the action is rapid and the energy which has to be provided by $V_g$ is small, thus leading to reduced power consumption.

FIG. 6 is a variant of FIG. 5. In this case, the subordination of the control circuit to the main circuit is achieved by a transformer $t_2$ through which primary winding current I flows. When I drops, the secondary winding of $t_2$ strengthens current $i_{g1}$ which passes through a shunt connection 7 including capacitor 16. The advantageous results are similar to those obtained with the control circuit of FIG. 5.

The improved circuits above described for FIGS. 4 and 5 can be applied to the control of several power devices connected in series and FIG. 7 represents such a series adaptation of the circuit of FIG. 5. There can be seen a plurality of power tecnetrons $T_1$, $T_2$, $T_3$, etc., connected in series; the first of them is controlled by a voltage source of control voltage $V_g$ associated with a control transformer $t_1$ and a capacitor 15. When switch *m* is closed, it acts on neck 41 which causes an accelerated blocking of the device $T_1$. The corresponding increase of recovery voltage in the channel of $T_1$ controls by a connection 32 and through the primary of a transformer $t_2$ (similar to $t_1$) the bias of the neck of $T_2$. The secondary of $t_2$ is connected through a condenser 15′ to the anode end of $T_2$ as shown. The voltage across the ends of the channel of $T_2$ being thereby increased, it controls in a similar way the neck 43 of $T_3$ by a connection 33 comprising the primary of a transformer $t_3$, the secondary of which is connected through a condenser 15″ to the anode end of $T_3$ and so on.

The cascaded control action of successive connections 32, 33, 34, etc., is rapid according to the operation of FIG. 5, and the energy which is required for controlling the bias of necks 42, 43, etc., has to be provided by the single source of control voltage $V_g$, whereby the voltage and power of this source remain small.

In similar ways the arrangements according to FIG. 4 or 6 or their modifications can be used for controlling in cascade a plurality of tecnetrons $T_1$, $T_2$, $T_3$, etc., operating in series as direct-current switches.

In the preceding embodiments, the blocking of direct current circuits was considered, but the invention can also be applied for the switching of alternating current circuits. FIG. 8 represents a schematic diagram of an embodiment of an alternating current switch.

In FIG. 8, two power tecnetron units $T_1$ and $T_2$, are coupled in a reversed parallel arrangement which provides in a known manner for the passage of both half waves of the operating current supplied by the single phase power source $V_1$. A critical feature of the circuit embodiment of FIG. 8 is that the necks are interconnected as shown to control both of the parallel units. The single control source $V_g$ provides, under low power and energy requirement, a striction bias voltage to both units, leading to improved efficiency.

This circuit in FIG. 8 is completed by the control transformer $t_4$ the function of which in principle is similar to the function of transformer $t_1$ in FIG. 5. It comprises primary winding $p$ and two secondary windings $s_1$ and $s_2$ which are respectively connected to the common terminals of the two power tecnetron devices $T_1$ and $T_2$ by means of diodes $D_1$ and $D_2$. This provides an efficient alternating current switch. Instead of applying this arrangement, it is possible to subordinate the control circuit to the main current $I_1$ according to the principles of FIG. 6.

Regardless of the mode of subordination chosen, e.g., whether that of FIG. 6 or FIG. 5, the closing of the switch $m$ assures the accelerated evacuation of the minority charge carriers of the two switch units, independently of the direction of current $I_1$ and of the further permanent blocking due to voltage $V_g$.

Capacitors 13, as shown in FIGS. 4, 5, 6 and 8, are useful for imposing suitable time constants on the operating circuits to thus limit the voltage recovery speeds between the anodes and cathodes during the blocking process. On the other hand, in FIG. 2, capacitor 13 facilitates the extraction of minority carriers located between the anode and neck and, in FIG. 3, the capacitor facilitates the extraction of minority carriers located between the cathode and neck of the field-effect tecnetron. Capacitor 14, shown in FIGS. 3 and 4, can also facilitate extraction of the carriers located between the cathode and neck in the circuits.

It is emphasized that the embodiments described herein can be modified in various ways without going outside the scope of the present invention. In particular, control switches $m$ can have the form of static devices with intermittent conductivity and the continuous control voltage sources $V_g$ can be replaced in certain applications by suitable impulse generators, etc.

Tecnetron semiconductor devices are known, inter alia, from a number of United States patents.

Their basic principle is fully disclosed in Patent No. 2,987,659 which describes the modulation of the conductance of a semiconductive zone by a centripetal electric field effect. This patent covering the low power tecnetrons, high power tecnetrons are, for instance, fully described in U.S. Patents No. 2,930,950, 2,939,057, 2,980,809 and 3,176,203.

The new circuit combination of the present invention, especially as illustrated in FIGS. 4–8 herein, provides rapid switching results for high voltage operation which are surprisingly superior to those used heretofore. Especially advantageous is the economy of the power requirement for control of the new switching circuits for alternating current and direct current.

I claim:

1. A static switching circuit comprising at least one power tecnetron device of the known semiconductor type, a first main terminal having the form of a pn anode junction, a socket having a plurality of protruding channel sections, annular control electrodes surrounding said channel sections and adapted to block the conductivity of said channel sections by field-effect through extraction of the minority carriers and extension of the depletion layers, a connection to said control electrodes, a second main terminal having the form of a cathode junction to the ends of all said channel sections carrying light to heavy impurity concentrations, a load circuit including, a source of load current connected to said second main terminal, and at least one control circuit comprising a control switch, adjusting impedance means and control voltage source which are interconnected in series between said control electrodes connection to the annular control electrodes and the junction point between the external load and the load current source including thus in series said source with said source of control voltage.

2. A static switching circuit comprising at least one power tecnetron, a first main terminal having the form of pn anode junction, a socket having a plurality of protruding channel sections, annular control electrodes surrounding said channel sections and adapted to block their conductivity by a field-effect through extraction of their minority carriers and extension of the depletion layers, a connection to said control electrodes, a second main terminal having the form of a cathode junction to the ends of all said channel sections carrying light to heavy impurity concentration, a load circuit including in series a source of load current and a load interconnected between said main terminals, a first control circuit interconnected between said first terminal and said connection to annular control-electrodes, said first control circuit comprising a condenser, the secondary winding of a control transformer and an adjusting impedance, and a second control circuit interconnected between said second main terminal and said connection to control electrodes and said second control circuit comprising a source of control voltage, the primary winding of said control transformer, a control switch and said adjusting impedance.

3. A static switching circuit as claimed in claim 7, wherein said load circuit is provided by a plurality of tecnetron units, each connected to the other in series, the main anode terminal of one being connected to the main cathode terminal of the other in cascaded array, and wherein the connection to said annular electrodes of each unit is connected to a primary winding of a control transformer, the secondary winding of each of said control transformers being connected in turn through a capacitor to a main terminal of a consecutive unit in the cascade.

4. A static switching circuit as claimed in claim 7 adapted to control an A.C. load current, wherein said load circuit is provided with a pair of tecnetron units connected to each other in inverted relation with a common interconnection between the annular control electrodes of both of the units, the load circuit including an alternating current source and two control circuits including a coupling transformer comprising in series a primary winding, a control switch and a source of control voltage connected to said common interconnection and two secondary windings, each of said secondary windings being connected through additional diodes to the main terminals of each of the respective units, so as to produce by closing the switch said accelerated evacuation of the minority charges in both of the units.

5. A static switching circuit comprising at least one power tecnetron device comprising a first main terminal having the form of pn anode junction, a socket having a plurality of protruding channel sections, annular control electrodes surrounding said channel sections and adapted to block their conductivity by a field-effect through extraction of their minority carriers and extension of the depletion layers, a connection to said control electrodes, a second main terminal having the form of a cathode junction to the ends of all of said channel sections carrying light to heavy impurity concentrations, a load circuit including in series a source of load current, the primary winding of a control transformer and a load interconnected between said main terminals, a first control circuit interconnected between said first terminal and said connection to annular control-electrodes, comprising a condenser, the secondary winding of said control transformer and an adjusting impedance, and a second control circuit interconnected between said second main terminal and said connection to control electrodes, said second control circuit comprising a source of control voltage, a control switch and said adjusting impedance.

References Cited

"New Tecnetrons Switch 15 AMP," by Erikson in Electronics, dated Sept. 6, 1963, pp. 75 and 77.

JOHN S. HEYMAN, *Primary Examiner.*

S. D. MILLER, *Assistant Examiner.*

U.S. Cl. X.R.

307—300, 299, 251